United States Patent [19]

Rössler

[11] 4,169,291
[45] Sep. 25, 1979

[54] EPROM USING A V-MOS FLOATING GATE MEMORY CELL

[75] Inventor: Bernward Rössler, Münich, Fed. Rep. of Germany

[73] Assignee: Siemens Aktiengesellschaft, Berlin & Munich, Fed. Rep. of Germany

[21] Appl. No.: 875,745

[22] Filed: Feb. 6, 1978

[30] Foreign Application Priority Data

Feb. 14, 1977 [DE] Fed. Rep. of Germany ....... 2706155

[51] Int. Cl.² .................... G11C 11/40; G11C 17/00
[52] U.S. Cl. .................................. 365/185; 357/55; 365/104; 365/182
[58] Field of Search ........................ 357/20, 55, 60; 365/174, 182, 185, 186, 104

[56] References Cited

U.S. PATENT DOCUMENTS

| | | | |
|---|---|---|---|
| 3,660,819 | 5/1972 | Bentchkonsky | 317/235 R |
| 3,662,187 | 5/1972 | Ayres et al. | 307/229 |
| 3,728,695 | 4/1973 | Bentchkowsky | 340/173 R |
| 3,825,945 | 7/1974 | Masuoka | 357/23 |
| 3,893,085 | 7/1975 | Hansen | 340/173 R |
| 3,936,811 | 2/1976 | Horninger | 340/173 AM |
| 3,938,108 | 2/1976 | Salsbury et al. | 340/173 R |
| 3,952,325 | 4/1976 | Beale et al. | 357/23 |

FOREIGN PATENT DOCUMENTS

49-15380 2/1974 Japan .

OTHER PUBLICATIONS

Rodgers et al., V MOS ROM, IEEE Journal of Solid-State Circuits, vol. SC-11, No. 5, 11/76, pp. 614-621.
Jenne et al., V MOS EPROM and Buried Source RAM Devices, International Electron Devices Meeting, Wash., D.C., 12/6/76, Late News, pp. 2-3.
Iizuka et al., Stacked-Gate Avalanche-Injection Type MOS (SAMOS) Memory, Proceedings of the 4th Conference on Solid-State Devices, 1972, Tokyo, Supplement to the Journal of the Japan Society of Applied Physics, vol. 42, 1973, pp. 158-166.
McMOS Handbook, Motorola Semiconductors, First Edition, 1973, pp. 6-20, 6-21, 14-29.
Verney et al., AtMOS-An Electrically Reprogrammable Read-Only Memory Device, IEEE Transactions on Electron Devices, vol. ED-21, No. 10, pp. 631-636, 10/74.
Rodgers et al., Short-Channel V-Groove MOS (V MOS) Logic, IEEE International Solid-State Circuits Conference, 2/14/74, pp. 112-113.
Altman, Preview of ISSCC Excites Designers, Electronics, 12/25/76, pp. 50-51.
Bentchkowsky FAMOS-A New Semiconductor Charge Storage Device, Solid-State Electronics, 1974, vol. 17, pp. 517-529, Perganon Press.
Taroi, Electrically Reprogrammable Nonvolatile Semiconductor Memory, IEEE Journal of Solid-State Circuits, 10/72, pp. 369-375.
Taroi et al., Proposal of Electrically Reprogrammable Nonvolatile Semicond. Memory, Proc. of the 3rd Conference on Solid State Devices, Tokyo, 1971, Supplement to Oyo Buturi, vol. 41, 1972, pp. 155-162.
Rodgers et al., V MOS: High-Speed TTL Compatible MOS Logic, IEEE Journal of Solid-State Circuits, vol. SC-9, No. 5, 10/74, pp. 239-250.

Primary Examiner—Stuart N. Hecker
Attorney, Agent, or Firm—Hill, Van Santen, Steadman, Chiara & Simpson

[57] ABSTRACT

An electronic memory is disclosed which is produced by integrated techniques. The memory comprises a matrix store with MOS-FETs which have one floating and one controllable gate and are produced in a V-MOS technique. Data words of several bits can be read out and programmed. Erasing is by means of ultraviolet light. The store is applicable for memories in data processing installations including switching installations.

9 Claims, 3 Drawing Figures

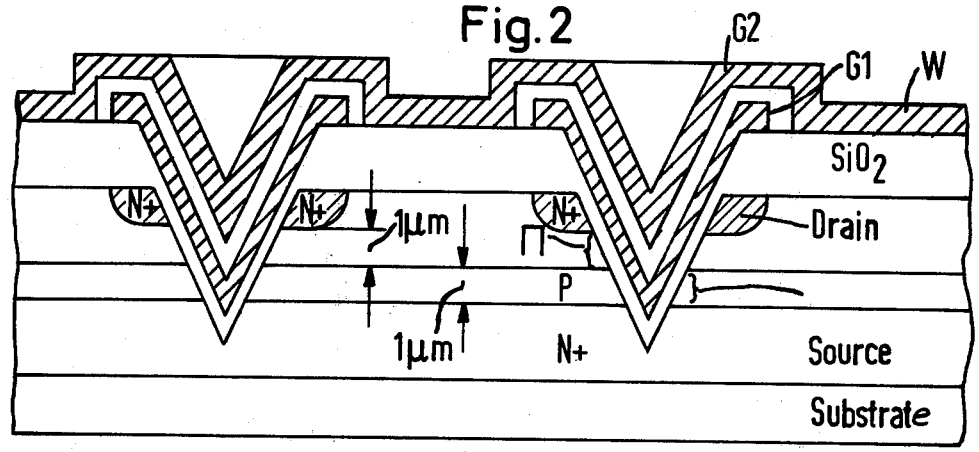
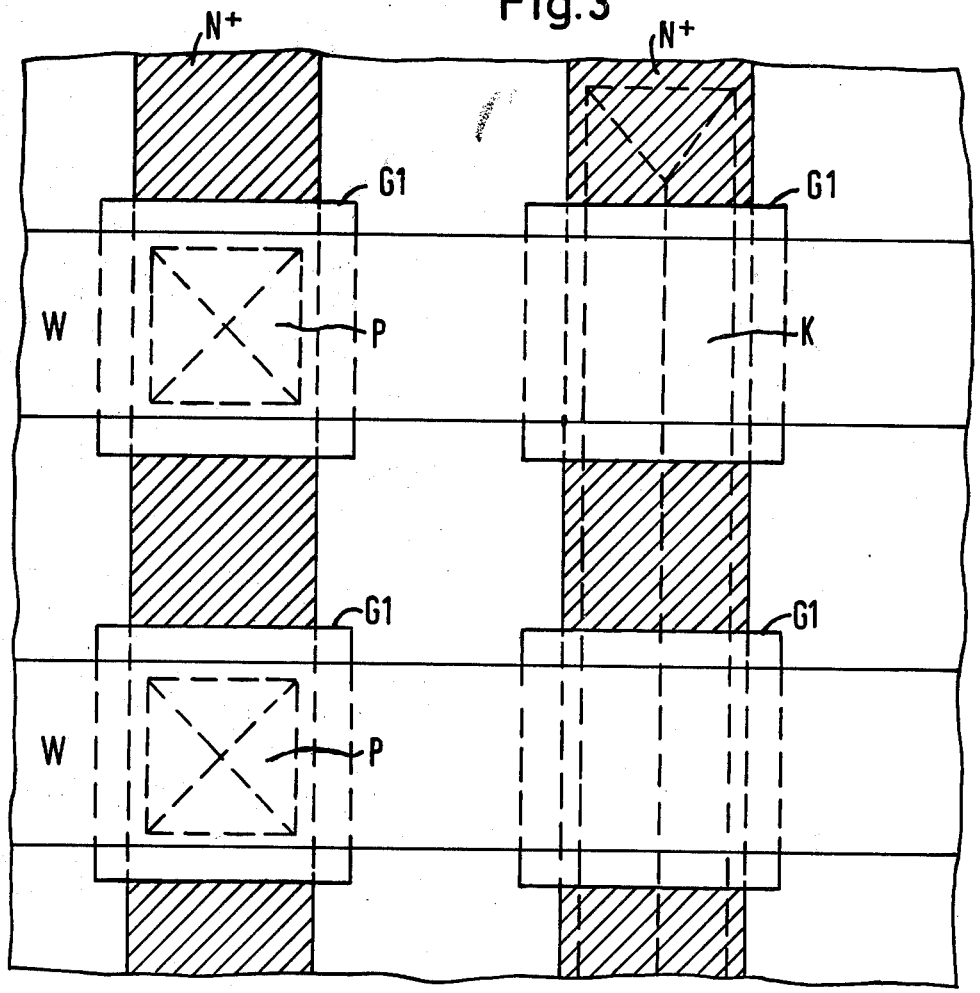

EPROM USING A V-MOS FLOATING GATE MEMORY CELL

BACKGROUND OF THE INVENTION

U.S. Pat. No. 4,087,795 relates to an electronic store which is produced according to integrated technology and comprises a plurality of electrically programmable storage FETs. The FETs each possess an insulated, floating storage gate and a controllable control gate. The two gates of each storage FET are capacitively coupled to one another and the two gates act upon the main path of the associated storage FET. The storage cells, which are arranged to form a matrix, each contain only one single FET, namely the storage FET whose control gate is in each case connected to a control line of a first matrix dimension and whose drain terminal is in each case connected to a control line of a further matrix dimension. U.S. Pat. No. 4,087,795 explains that a store of this kind can be designed in such manner that all the source terminals of the storage FETs are connected to a common circuit point, that each storage FET is a n-channel FET and possesses enhancement type properties relative to its controllable control gate in the unprogrammed state. Its storage gate is charged with negative charges during programming by means of channel injection. The storage FETs and the associated control unit are arranged on the same semiconductor carrier.

It is also already known (see German Offenlegungsschrift No. 26 01 622) in an electronic store of this kind to connect the read-out voltage to the control lines of the matrix via decoders which select these control lines on the basis of supplied address words which are decoded and which each consist of a plurality of bits. For programming, a programming voltage is connected, instead of the read-out voltage, via these decoders. Decoders of this kind are constructed with the aid of transistors which each require a plurality of transistors for each control line. Furthermore, additional special voltages are required for the execution of these processes (see FIGS. 4, 5, 6 with voltages V1, V2, V3, common ground 16, storage ground 18 in OS 26 01 622. Here again the storage FETs have a floating storage gate. The store can be erased by being exposed to ultra-violet light.

It is also already known to produce integrated circuits having a plurality of transistors in the so-called V-MOS technique (see IEEE Journal of Solid-State Circuits VOL. SC-9, No. 15, October 1974, pages 239 to 250 and VOL. SC-11, No. 5, October 1976, pages 614 to 621). In this technique the individual n-channel FETs are produced with the aid of pyramid-shaped holes which are etched into the semiconductor carrier. It is also possible to produce a plurality of FETs, lying in the same matrix dimension, with the aid of a common, wedge-shaped, etched recess. In any case, the recess has a V-shaped cross-section. These circuits also include an electronic store (see above-mentioned publication, page 617, FIG. 8) which has V-MOS FETs which are employed as storage cells but which do not possess a floating gate. Therefore this is a store which is not electrically programmable in the manner described in U.S. application Ser. No. 750,860. Here again the read-out voltage is supplied via decoders. Stored words each comprising a plurality of bits are in each case read-out and are interrogated by means of a decoder which is provided for the first matrix dimension and which selects one single control line for the word selection. A decoder is provided for the further matrix dimension and which, for the word selection, simultaneously selects for each bit position one of a plurality of control lines provided for each bit position. The operating voltage is connected to the control lines via series resistors. Here again the decoders are constructed from V-MOS FETs which are connected to the aforementioned control lines. Of these V-MOS FETs, in the case of the control lines of the storage FETs not selected for read-out, with respect to each control line, at least one is rendered conductive, whereas for the aforementioned V-MOS FETs which are connected to control lines of the storage FETs selected for read-out, none are rendered conductive. Here again, the relevant control lines are connected to transistor amplifiers which lead to the output terminals of the store. These transistor amplifiers are constructed from V-MOS FETs and planar enhancement transistors. These transistor amplifiers possess outputs which, during operation, are either blocked in high-ohmic fashion or assume one of two given, comparatively low-ohmic electrical states which belong to binary output signals, so-called tri-state outputs (see e.g. Siemens Mikroprozessoren und Mikrocomputer by Hans-Peter Lohmeyer-Bartenstein, pages 28, 29 and McMOS-Handbook, Motorola Semiconductors, First Edition October 1973, pages 6.20, 6.21, 14.29).

The V-MOS technique for storage FETs as employed in the above described known store does in fact have the advantage that the individual n-channel storage FETs each possess a very short channel. They possess a high operating speed and also have the advantage that they consume only a relatively low operating voltage (see "Electronics", 25th December 1975, pages 50 and 51; 1974 IEEE International Solid-State Circuits Conference, pages 112 and 113). However, they have the disadvantage that they do not possess a floating gate and therefore the store which they form is not electronically programmable. In the meantime, V-MOS FETs have also become known which should be employed as storage FETs and which, in spite of the presence of an additional floating storage gate, have the same above described advantageous properties as the other V-MOS FETs (see Supplement to International Electron Devices Meeting 1976, Washington, D.C., Catalogue No. 76 CH 1151-OED, sponsored by Elektron Devices Society of IEEE). However, it is not known to employ V-MOS FETs of this kind in an electronic store having a plurality of matrix dimensions, although V-MOS FETs without a floating storage gate are known to be suitable for the production of a store having a relatively high storage capacity per surface unit.

SUMMARY OF THE INVENTION

An object of the invention is to construct an electronic store having two matrix dimensions employing electrically programmable storage FETs which each possess an insulated, floating storage gate and a controllable control gate. The device storage capacity per surface unit is to be very high, and operating voltages are to be both few in number and as low as possible, particularly during programming. The space requirement for the associated control unit should also be small. Furthermore, the store should have a high operating speed. The store in accordance with the invention ws developed in particular for use in a telephone exchange system.

The store in accordance with the invention is based upon an electronic store which is produced in the integrated technique and which comprises a plurality of electrically programmable storage FETs, each of which possess an insulated, floating storage gate and a controllable control gate. The two gates of each storage FET are capacitively coupled to one another and the two gates influence the main path of the associated storage FET. The storage cells are arranged to form a matrix and each contain only one single FET, namely the storage FET whose control gate is in each case connected to a control line of a first matrix dimension, and whose drain terminal is in each case connected to a control line of a further matrix dimension. All the source terminals of the storage FETs are connected to a common circuit point. Each storage FET is a n-channel FET and has enhancement type properties relative to its controllable control gate in the unprogrammed state. Its storage gate is charged with negative charges during programming by means of channel injection. The storage FETs and the associated control unit are arranged on the same semi-conductor carrier in accordance with German Pat. No. 24 45 078. The invention is characterized by the combination of the following measures or steps for the electrical programming of storage FETs, which are produced in the V-MOS technique, and which are employed as storage cells during the write-in of data words into the store when the latter is in the original or erased state. Known steps are employed for the read-out of storage words which each comprise a plurality of bits which are interrogated by means of a decoder which is provided for the first matrix dimension and which in each case selects one single control line for the word selection. A decoder is also employed for the further matrix dimension which, during the word selection, for each bit position, simultaneously selects one of a plurality of control lines provided for each bit position. The bits which each correspond to a word are supplied via output terminals which are individually assigned to the bit positions of the words and which are each connected to the control lines associated with the same bit position via decoupling switching means.

(a) Steps for the read-out of data words are as follows: the source terminals are connected to ground potential, and, during read-out, the control lines are connected via series resistors to an operating potential at the level of the read-out voltage; at the same time, of the V-MOS FETs connected to the control lines of the decoders constructed therefrom and in the case of the control lines of the storage FETs not selected for read-out, at least one of the FETs is rendered conductive with respect to each control line; and of the V-MOS FETs which form the decoders and which are connected to control lines of the storage FETs selected for read-out, none is rendered conductive.

(b) Steps for the write-in of data words are as follows: the control lines of the further matrix dimension are connected to additional control V-MOS FETs whose source terminals are connected to ground potential; the gates of the control V-MOS FETs whose control lines are assigned to the same bit position are connected, and the operating potential is connected at this point via a series resistor; for the write-in of a word, for programming purposes an operating potential is supplied at the level of the programming voltage; the decoders are employed for word selection both during write-in and during read-out; the control V-MOS FETs of those bit positions whose storage FETs are established as unprogrammed during write-in are rendered conductive.

The use of n-channel V-MOS transistors as storage cells having a floating storage gate and a controllable storage gate allows the use of low voltages for operation, facilitates electrical programmability, and ensures a high operating speed. It is ensured that only two different voltages are required for the operation of the store since: the given decoders are employed; during read-out an operating potential at the level of the read-out voltage is employed; and during write-in of data words an operating potential at the level of the programming voltage is connected to the series resistors of the control lines. The additional expense with respect to transistors for programming is also low since the number of additional transistors required for this purpose corresponds to the number of control lines of the further matrix dimension. These transistors also occupy a small amount of space and can be integrated on the semiconductor carrier in the same way as the actual storage FETs. Furthermore, the normally attainable high storage capacity per surface unit can still be achieved as the V-MOS FETs here employed as storage cells can be integrated without an additional space requirement on the semiconductor carrier, although here they possess two gates instead of one as is common. Further details will be given below. Accordingly, the provision of special contact points requiring additional space for the connection of the drain terminals, as normally required in stores of similar construction, is avoided (see Siemens-Forschungs und Entwicklungs, Berichter, Vol. 4 (1975) No. 6, pages 345 to 351, in particular FIG. 5 on page 351). All these advantages are achieved by means of the combination, provided by the invention, of new steps for the electrical programming, and the partially known steps for the read-out of data words.

Preferably the output terminals are additionally employed for the write-in of data words. For this purpose they are also connected to the linked gates of the control V-MOS FETs. The control lines via which the data words are supplied on read-out are connected to the output terminals via V-MOS FETs serving for decoupling purposes and via transistor amplifiers. During the write-in of a data word, blocking circuits are used to block the transistor amplifiers, whereas the aforementioned control V-MOS FETs are blocking during the read-out of a data word. The blocking circuits which are provided with respect to each bit position, comprise V-MOS FETs which are each connected to an additional line corresponding to the control lines of the further matrix dimension. The additional exploitation of the output terminals achieves the advantage that the number of terminals required on the same semiconductor carrier remains small.

BRIEF DESCRIPTION OF THE DRAWINGS

FIG. 2 shows a sectional view through two storage FETs employed as storage cells; and FIG. 3 schematically illustrates an example of the distribution of storage FETs in the store, and for the arrangement of control lines.

DESCRIPTION OF THE PREFERRED EMBODIMENTS

Figure 1:
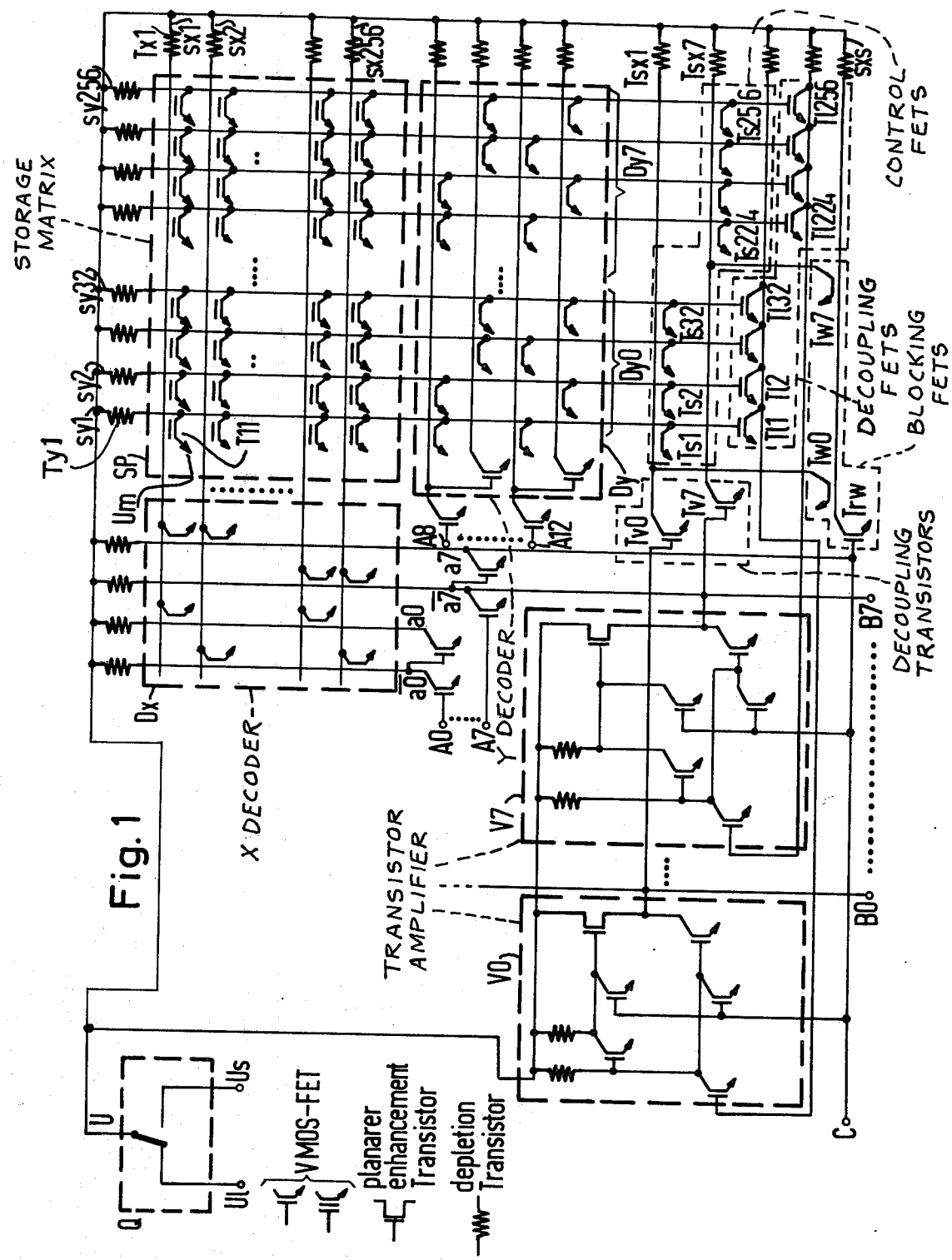
FIG. 1 is a schematic diagram illustrating an example of the circuit of the electronic store.

A portion of the contents of the electronic store illustrated in FIG. 1 consists of a plurality of sub-circuits whose circuit elements are in each case combined in a fundamentally known manner. For the storage unit, the sub-circuit SP contains the storage FETs employed as storage cells which are produced in the V-MOS technique and which include the transistor T11. The control gates of these transistors are connected to the control lines sx1 ... sx256 of the first matrix dimension and which connect with the operating potential U via series resistors, including the series resistor Tx1. The drain terminals of the storage FETs are connected to the control lines sy1 ... sy256, which are likewise connected to the operating potential U via series resistors, including the series resistor Ty1. The source terminals of all these storage FETs are connected to ground potential Um, as indicated by the reference Um in the case of the transistor T11. A further sub-circuit consists of the decoder Dx, with the aid of which one of the control lines sx1 ... sx256 is selected. This is assembled in known manner employing V-MOS FETs and possesses the input terminals A0 ... A7 via each of which a word address consisting of eight bits can be supplied. Each of these bits is assigned two vertically illustrated lines of this decoder, to which the gates of the FETs are connected. The drain terminals of these FETs are connected to control lines of the first matrix dimension. All the source terminals are connected to ground potential Um. Each bit of a word address is assigned two of the aforementioned vertical lines, e.g. the bit supplied via the input terminal A0 is assigned the two lines referenced $\overline{a0}$ and a0. Between these two lines and the input terminal A0 there are also interposed two V-MOS FETs, so that the one line is fed with the supplied bit in amplified form and the other line is fed with the supplied bit in both amplified and inverted form. The other input terminals are connected to the other vertical lines of the decoder Dx via FETs in a corresponding fashion. Also provided is the decoder Dy, which is likewise constructed in fundamentally known fashion with V-MOS FETs and which in the word selection for the further matrix dimension, with respect to each bit position, simultaneously selects one of a plurality of control lines provided for each bit position. This relates to the control lines sy1 ... sy256. This decoder Dy consists of the eight sub-decoders Dy0 ... Dy7. When a word address is supplied to the input terminals A8 ... A12 of the decoder Dy, each of these sub-decoders selects one of the aforementioned control lines so that a total of eight control lines are selected from the control lines sy1 ... sy256. The aforementioned decoders are employed for the read-out and write-in of data words. The storage FETs whose control gates are connected to one and the same control line of the first matrix plane, e.g. to the control line sx1, can therefore each accommodate a total of 32 data words each comprising eight bits. Each of the sub-decoders Dy0 ... Dy7 must select from 32 control lines of the further matrix plane. Thus the decoder Dy0 must select from the control lines sy1 ... sy32. Also, in the case of the decoder Dy, the input terminals A8 ... A12 are connected via additional V-MOS FETs to the associated control lines, as in the case of the decoder Dx. The V-MOS FETs which belong to the decoder Dy are interposed into the circuit in the same manner as those belonging to the decoder Dx.

The bits which in each case form a word are supplied via the output terminals B0 ... B7 which are individually assigned to the bit positions of the words. The output terminal B0 is assigned to the first bit position of the words. A selection is made from the associated control lines sy1 ... sy32 with the aid of the sub-decoder Dy1. The bits which are to be supplied are forwarded with the aid of the V-MOS FETs T11 ... T132 which are each individually connected by their gates to the aforementioned control lines and whose drain terminals, which are connected to one another, are connected to an operating potential U via a series resistor. Furthermore, the connected drain terminals are connected via the transistor amplifier V0 to the input terminal B0. Here the transistors T11 ... T132 serve as decoupling switching means. The transistor amplifier V0 serves for additional amplification. It is constructed in known manner. Its tri-state output consists of the output terminal B0. The other bits of data words are supplied correspondingly via transistors and transistor amplifiers including the transistors T1224 ... T1256 and the amplifier transistor V7 whose tri-state output consists of the output terminal B7. With the aid of the sub-circuit Q, here shown only schematically, the operating potential U can be connected at the level of the read-out voltage U1 or at the level of the programming voltage Us. The read-out voltage U1 can amount, for example, to 5 V and the programming voltage Us for example to 12 V. This sub-circuit is an electronic switch-over device which can be switched in known manner. It is not necessary for this switch-over device to be arranged on the semiconductor carrier itself.

FIG. 1 also illustrates the symbols used for the V-MOS FETs. The source terminals, which are each symbolized by an arrow head, are always connected to ground potential Um. Planar enhancement transistors employed in the circuit are represented by a different symbol which is specially shown in FIG. 1. The series registors of the control lines and other lines, such as the series resistors Ty1, Tx1, Tsx1, ... can also be formed by depletion transistors whose gates are in each case connected to their sources. The symbol employed for this purpose is likewise separately shown in FIG. 1.

Those sub-devices of the store shown in FIG. 1 which must be employed for the read-out of data words have already been dealt with above. The storage FETs which contain a data word are partially programmed and partially unprogrammed, as described in U.S. Pat. No. 4,087,795. In the case of a program storage FET, the floating storage gate is negatively charged. Therefore during a read-out process, it is not rendered conductive. The read-out voltage U1 connected to the control lines sx1 and sy1 via the series resistors Tx1 and Ty1 for the read-out of data words therefore is only retained on the control line sy1 during the read-out of the storage FET T11 when this storage FET T11 is programmed. Otherwise, when it is not programmed, it goes conductive and the read-out voltage U1 connected to the control line sy1 is discharged via the main current path of the storage FET T11 since the latter's source terminal is connected to ground potential Um. If, on the other hand, the storage FET T11 is programmed, the read-out voltage U1 carried on the control line sy1 is retained, and accordingly acts upon the output terminal B0 via the deoupling transistor T11 and the transistor amplifier V0. This is conditional upon none of the V-MOS FETs connected to the control line being driven conductive in the decoder Dy0, which is the case when the decoder Dy has selected this control line. It is also conditional upon none of the V-MOS FETs connected to the control line sx 1 being conductive in the decoder Dx, which is the case when this control line has been selected by the decoder Dx. In this case the other control lines sx2 . . . sx256 are each conductively connected via the main current path of at least one V-MOS FET of the decoder Dx to its source terminal which is connected to earth potential Um, so that the read-out voltage U1 is discharged from these control lines. The discharge of the read-out voltage U1 from the relevant control lines serves to avoid a short-circuit due to the presence of the associated series resistances. Thus the read-out voltage only influences an output terminal in a specific fashion when the relevant storage FET is programmed during the read-out of a word. Otherwise the path leading to the relevant output terminal is subject to ground potential, which results in a different voltage than normal being connected to the relevant output terminal.

The above considered transistor T11 is assigned to the first bit of a data word. The other sub-decoders of the decoder Dy are assigned to the storage FETs associated with the other bits of the relevant data word. Therefore, during the read out of the data word, the other output terminals including the output terminal B7 are likewise influenced in a specific fashion, by read-out potential or ground potential, so that the read-out data word is present at the output terminals B0 . . . B7. In the case of the circuit for the store as shown in FIG. 1, during the read-out of a programmed storage FET, the particular associated decoupling transistor, e.g. the decoupling transistor T11, is blocked, which results in the associated transistor amplifier, here the transistor amplifier V0, being driven in such manner that the read-out voltage U1 occurs across the relevant output terminal, here the output terminal B0. If, on the other hand, the relevant storage FET is programmed, the relevant decoupling transistor is not blocked so that the associated transistor amplifier connects ground potential to the relevant output terminal.

In order that data words may be correctly written into the store, the control lines sy1 . . . sy256 are connected to the drain terminals of the additional control V-MOS FETs Ts1 . . . Ts256, whose source terminals are connected to ground potential Um. The gates of the control V-MOS FETs Ts1 . . . Ts32 are connected, as the associated control lines sy1 . . . sy32 are assigned to the same bit position. At this point the operating potential U is also connected via the series resistor Tsx1. Correspondingly, the gates of the other control V-MOS FETs are connected, and at this point the operating potential U is connected, as also indicated for the control V-MOS FETs Ts224 . . . Ts256 and the series resistor Tsx7. During the write-in of a data word, for programming purposes the operating potential is supplied at the level of the programming voltage Us. The decoders Dx and Dy are used for word selection both during write-in and during read-out. This results in the fact that the control lines which are each connected to a storage FET belonging to a selected data word possess the programming voltage Us, since the V-MOS FETs connected to the decoders Dx and Dy are not driven conductive. Therefore without the provision of additional steps, all the storage FETs belonging to a selected word would be programmed. Here it has been assumed that on the write-in of data words, the store occupies the original or erased state. However, generally speaking not all the storage FETs assigned to a stored word require to be programmed. Here this is achieved in that the control V-MOS FETs of those bit positions whose storage FETs are not to be programmed during the write-in of a data word, are driven conductive. This driving conductive here is expediently effected via the output terminals B0 . . . B7. For this purpose, for example, the output terminal B0 is connected via the decoupling transistor Tv0 to the line leading to the series resistor Tsx1. In a corresponding fashion, the other output terminals, including the output terminal B7, are connected to the other, corresponding lines via decoupling transistors. The gate of a decoupling transistor is in each case connected to the relevant output terminal, the drain terminal to the gates of the relevant control V-MOS FETs, and its source terminal is connected to ground potential. Correspondingly, the output terminal B7 is also connected via the decoupling transistor Tv7 to the line leading to the series resistor Tsx7. If the decoupling transistors Tv0 . . . Tv7 were not provided, the data word to be written in could be connected in unmodified form to the output terminals B0 . . . B7, since then the control V-MOS FETs of those bit positions whose storage FETs are not to be programmed during the write-in of data words are driven conductive. On the other hand, because of the presence of the decoupling transistors Tv0 . . . Tv7, a data word which is to be written into the store must be supplied in inverted form to the output terminals B0 . . . B7. The decoupling transistors Tv0 . . . Tv7 prevent disturbance of the state wherein the outputs of the transistor amplifiers are blocked in high-ohmic fashion.

It is also necessary that the circuit components specially provided for the read-out of data words and the write-in of data words should not undesirably influence one another. For this purpose the amplifier stages V0 . . . V7 are blocked during the write-in of a data word. On the other hand, the control V-MOS FETs Ts1 . . . Ts256 are blocked during the read-out of a data word. For this purpose, with respect to each bit position there are provided blocking circuits which comprise the V-MOS FETs Trw, Tw1 . . . Tw8. These FETs are connected to an additional line sxs which corresponds to the control lines of the further matrix dimension and to which the operating potential U is connected via a series resistor. Via the control terminal C and the FET Trw, the FETs Tw0 . . . Tw7 are driven conductive during the read-out of a stored word, whereby the control V-MOS FETs Ts1 . . . Ts256 are blocked. For the write-in of data words, the FETs Tw0 . . . Tw7 are blocked via the terminal C and the FET Trw, and furthermore in the transistor amplifiers V0 . . . V7 which are likewise connected to the control terminal C, the tri-state outputs are blocked in high-ohmic fashion. This prevents the disturbance of the write-in of data words by these amplifier stages.

In the store which has been described with reference to FIG. 1, storage FETs which also possess a floating gate and are produced in the V-MOS technique have been combined in a matrix in a novel manner. The source terminals of all these storage FETs are connected in a manner known per se, and are embedded into the substrate. However, then a further step consists in connecting the drain terminals and the control gates in accordance with the two matrix dimensions during production. An example in this respect is illustrated in FIGS. 2 and 3. Accordingly, the storage FETs are produced in the V-MOS technique in such manner that their drain terminals constitute components of a diffused-in drain layer which is divided into tracks and which possesses N—doping, that the control gates form parts of a conductive layer which is divided into tracks and the tracks of which are applied in insulated fashion, intersecting the tracks of the drain layer at right angles above the floating gate. The tracks then simultaneously form the control lines of the two matrix dimensions. FIG. 2 is a section covering two storage FETs whose control gates are connected to one another. On the substrate having N+doping into which the source terminals are embedded, is applied a layer which has a thickness of only 1 micrometer and which contains the channel paths. Above is arranged a layer, part of the contents of which is formed by the drain layer which is divided into tracks and which possesses N+doping. Above is arranged a further layer which consists of silicon dioxide SiO2 and which serves for insulation purposes. In these layers there are then formed pyramid-shaped or wedge-shaped etchings into which the floating storage gates G1 are applied, and above which the control gates G2 are applied in insulated fashion as components of the conductive layer W divided into tracks. Here it is possible to achieve a channel length of 1 micrometer, for which reason only low operating potentials, and in particular a low programming voltage, are necessary. It is also possible to form the so-called drift path referenced $\pi$ which, in known manner contributes to the avoidance of a breakthrough between source and drain of the transistor. The conductive layer W divided into tracks can also be seen in the diagram of FIG. 3. This can consist, for example, of polysilicon, molybdenum or aluminum. As can be seen from FIG. 3, it intersects the drain layer at right angles which is divided into tracks and which is referenced N+ in FIGS. 2 and 3. The pyramid-shaped and wedge-shaped etchings P and K are indicated by broken lines. The outlines of the floating storage gates G1 are also indicated, and it can be seen that these project beyond the control lines by which they would otherwise be covered and which are in each case formed by the tracks. This simplifies the erasure of the store by irradiation with ultraviolet light.

It is preferable to provide above the tracks N+ of N+doping additional applied unidirectional, metallic lines which are conductively connected to the associated track at intervals, each line extending over a plurality of drain terminals. By this means it is possible to avoid voltage drops across the tracks which could possibly be disturbing.

As can be seen from FIG. 1, similarly to the storage FETs T11..., the control MOS FETs Ts1... Ts256 are embedded between lines extending in the two matrix dimensions. Therefore the drain terminals and gates of these control V-MOS FETs can, similar to the drain terminals and control gates of the storage FETs, be embedded into the drain layer and into the relevant conductive layer. This confirms the fact that the FETs additionally required for programming purposes occupy only a very small amount of space on the semiconductor carrier. The majority of the FETs which form the control component are V-MOS FETs as can be seen from the circuit symbols in FIG. 1.

It should also be noted that an electronic store as has been described above can also be advantageously constructed with the aid of other MOS FETs having a floating gate and a control gate and which are not produced by the V-MOS technique. Even with MOS FETs of this kind, the floating gate can be charged by channel injection during programming (see e.g. German Patent application P 24 45 137). MOS FETs of this kind can on occasion also be erased electrically. In any case, an electronic store of this kind will retain the described advantages of low cost for additional transistors in the control unit for programming purposes and in a small number of operating potentials. Therefore steps in accordance with the invention are also supplied to stores of this kind.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. In an electronic store for storing words and for word selection comprising a plurality of bits, and which are produced by integrated circuit techniques, said store having:

a plurality of electrically programmable integrated storage field effect transistors (FETs) which each possess an insulated, floating storage gate and a controllable control gate, said storage and control gates of each storage FET being capacitively coupled to one another and also influence a main channel of the storage FET;

storage cells of the store being arranged to form a matrix with each cell containing only one of said storage FETs;

said control gate of each storage FET being connected to a control line of a first matrix dimension;

a drain terminal of each storage FET being connected to a control line of a second matrix dimension;

source terminals of the storage FETs all being connected to a common circuit point;

each storage FET being an n-channel FET and possessing enhancement type properties relative to its controllable control gate in the unprogrammed state, and its storage gate being charged with negative charges during programming by channel injection;

and said storage FETs and an associated control portion being arranged on a common semiconductor carrier;

wherein the improvement comprises:

said storage FETs comprising erasable V-shaped Metal-Oxide-Silicon (V-MOS) technique produced FETs;

a first decoder means for interrogating said storage FETs and which is provided for the first matrix dimension and which in each case selects one of said first matrix dimension control lines for word selection;

a second decoder means for said second matrix dimension and which during said word selection simultaneously for each bit position of a word selects at least one of said second matrix dimension control lines provided with respect to each bit position;

output terminal means for read-out of bits of said word, said output terminal means being individually assigned to the bit positions of the word;

read-out decoupling switching means for connecting each of the output terminal means to said second matrix dimension control lines assigned to a same bit position as the output terminal means;

operating potential means for connecting the first and second matrix dimension control lines via series resistors to a read-out operating potential during read-out and to a write-in operating potential during write-in;

write-in control V-MOS FETs having drain terminals connected to said second matrix dimension control lines, source terminals connected to said common circuit point and gates of the write-in control V-MOS FETs connecting to control lines of the same bit position being connected together and through a series resistance to said operating potential means; and said first and second decoder means operating for word selection both during write-in and read-out.

2. A store as claimed in claim 1, characterized in that said output terminal means also operate for write-in of data words and are connected to the corresponding connected together gates of said write-in control V-MOS FETs; and blocking circuit means for blocking an amplifier means between the output terminal means and read-out decoupling switching means during write-in and for blocking the control V-MOS FETs during read-out.

3. A store as claimed in claim 2, characterized in that between each output terminal and respective interconnected gates of said write-in control V-MOS FETs there is in each case interposed a decoupling transistor whose gate is connected to the respective output terminal, whose drain terminal is connected to the gates of the respective write-in control V-MOS FETs and whose source terminal is connected to said common circuit point.

4. A store as claimed in claim 1, characterized in that the storage FETs are produced in the V-MOS technique in such manner that their drain terminals form parts of a diffused-in drain layer which is divided into tracks and which possess N+doping, that the control gates form parts of a conductive layer which is divided into tracks and the tracks of which are arranged in insulated fashion above the floating storage gates and intersecting the tracks of the drain layer at right angles, and that the tracks in each case simultaneously form the first and second matrix dimension control lines.

5. A store as claimed in claim 4, characterized in that above the tracks forming the second matrix dimension control lines which possess N+doping there are arranged unidirectional, metallic lines which are conductively connected to the associated track at intervals in each case extending over a plurality of drain terminals.

6. A store as claimed in claim 4, characterized in that the drain terminals and gates of the control V-MOS FETs are embedded into the drain layer and into the respective conductive layer in the same way as the drain terminals and control gates of the storage FETs.

7. A store as claimed in claim 1, characterized in that the series resistors are formed by integrated depletion transistors whose gates are connected to their sources.

8. A store as claimed in claim 1, characterized in that means are provided to permit erasing by irradiation with ultraviolet light, said means comprising storage gates of the storage MOS-FETs projecting beyond the control lines by which they are otherwise covered.

9. A method for operating an electronic store, said store having:

a plurality of electrically programmable integrated storage FETs produced in the V-shaped Metal-Oxide-Silicon (V-MOS) technique which each possess an insulated, floating storage gate and a controllable control gate, storage cells of the store being arranged to form a matrix with each cell containing only one of said storage FETs;

said control gate of each storage FET being connected to a control line of a first matrix dimension;

a drain terminal of each storage FET being connected to a control line of a second matrix dimension;

source terminals of the storage FETs all being connected to a common circuit point;

comprising the steps of:

providing a first decoder means having a plurality of decoder V-MOS FETs for the first matrix dimension for interrogating said storage FETs and for selecting one of said first matrix dimension control lines for word selection;

providing a second decoder means having a plurality of decoder V-MOS FETs for said second matrix dimension and which during said word selection simultaneously for each bit position of a word selects one of a plurality of said second matrix dimension control lines provided with respect to each bit position;

providing output terminal means for feeding bits of said word, said output terminal means being individually assigned to the bit positions of the word;

providing read-out decoupling switching means for connecting each of the output terminal means to said second matrix dimension control lines assigned to a same bit position as the output terminal means;

reading out data words by connecting the first and second matrix dimension control lines to a read-out operating potential, and rendering conductive at least one of the decoder V-MOS FETs of the first and second decoder means connecting with each control line of storage FETs not selected for read-out, and not rendering conductive the decoder V-MOS FETs of the first and second decoder means which are connected to control lines of storage FETs selected for read-out;

providing write-in control V-MOS FETs for write-in connected to control lines of the second matrix dimension;

writing in data words by connecting a write-in operating potential to the control lines and writing in through the control FETs;

employing the decoder means for word selection both during write-in and read-out; and driving conductive the write-in control V-MOS FETs of bit positions whose corresponding storage FETs are not to be programmed during write-in.

* * * * *